(12) United States Patent
Fales et al.

(10) Patent No.: US 7,194,670 B2
(45) Date of Patent: Mar. 20, 2007

(54) COMMAND MULTIPLIER FOR BUILT-IN-SELF-TEST

(75) Inventors: Jonathan R. Fales, South Burlington, VT (US); Gregory J. Fredeman, Staatsburg, NY (US); Kevin W. Gorman, Fairfax, VT (US); Mark D. Jacunski, Colchester, VT (US); Toshiaki Kirihata, Poughkeepsie, NY (US); Alan D. Norris, Hinesburg, VT (US); Paul C. Parries, Wappingers Falls, NY (US); Matthew R. Wordeman, Kula, HI (US)

(73) Assignee: International Business Machines Corp., Armonk, NY (US)

( * ) Notice: Subject to any disclaimer, the term of this patent is extended or adjusted under 35 U.S.C. 154(b) by 419 days.

(21) Appl. No.: 10/708,184

(22) Filed: Feb. 13, 2004

(65) Prior Publication Data

US 2005/0193253 A1 Sep. 1, 2005

(51) Int. Cl.
*G01R 31/28* (2006.01)

(52) U.S. Cl. ...................... 714/733; 714/731

(58) Field of Classification Search ............ 714/724, 714/733, 731, 738
See application file for complete search history.

(56) References Cited

U.S. PATENT DOCUMENTS 4,903,266 A 2/1990 Hack ...................... 371/21.2

(Continued)

FOREIGN PATENT DOCUMENTS

JP 7078495 A 3/1995

(Continued)

OTHER PUBLICATIONS

"A 800MHz Embedded DRAM with a Concurrent Refresh Mode", Toshiaki Kirihata et al., IBM Microelectronics, Hopewell Junction, NY, pp. 1-6.

(Continued)

*Primary Examiner*—Cynthia Britt
(74) *Attorney, Agent, or Firm*—Robert A. Walsh; Micheal Lestrange (57) ABSTRACT

Disclosed is a flexible command multiplication scheme for the built-in-self test (BIST) of a high-speed embedded memory array that segments BIST functionality into remote lower-speed executable instructions and local higher-speed executable instructions. A stand-alone BIST logic controller operates at a lower frequency and communicates with a command multiplier using a low-speed BIST instruction seed set. The command multiplier uses offset or directive registers to drive a logic unit or ALU to generate "n" sets of CAD information which are then time-multiplexed to the embedded memory at a speed "n" times faster than the BIST operating speed.

8 Claims, 5 Drawing Sheets

U.S. PATENT DOCUMENTS

| | | | |
|---|---|---|---|
| 5,301,156 A * | 4/1994 | Talley | 365/201 |
| 5,388,104 A | 2/1995 | Shirotori et al. | 371/21.1 |
| 5,614,838 A | 3/1997 | Jaber et al. | 324/765 |
| 5,954,830 A | 9/1999 | Ternullo, Jr. | 714/718 |
| 6,001,662 A | 12/1999 | Correale, Jr. et al. | 438/11 |
| 6,055,658 A | 4/2000 | Jaber et al. | 714/726 |
| 6,294,935 B1 * | 9/2001 | Ott | 327/150 |
| 6,360,342 B1 | 3/2002 | Lee et al. | 714/718 |
| 6,550,033 B1 | 4/2003 | Dwork | 714/733 |
| 6,574,760 B1 | 6/2003 | Mydill | 714/724 |
| 6,583,642 B2 | 6/2003 | Huang et al. | 324/765 |
| 6,611,933 B1 | 8/2003 | Koenemann et al. | 714/726 |
| 6,647,524 B1 | 11/2003 | Huang et al. | 714/734 |
| 6,928,593 B1 * | 8/2005 | Halbert et al. | 714/718 |
| 7,032,162 B1 * | 4/2006 | Dhamankar | 714/784 |

FOREIGN PATENT DOCUMENTS

JP    2003229000 A    6/2003

OTHER PUBLICATIONS

"Fault Simulation on the YSE/EVE", Barzilai et al., IBM Technical Disclosure Bulletin, vol. 28, No. 2, Jul. 1985, pp. 773-776.

* cited by examiner

Sample CMX Command Op Codes

| Op Code | Operation |
|---------|-----------|
| 000 | NOP (seed independent) |
| 001 | READ (seed independent) |
| 010 | WRITE (seed independent) |
| 011 | *Unused* |
| 100 | Same Command as Seed |
| 101 | Opposite Command to Seed |
| 110 | *Unused* |
| 111 | *Unused* |

Sample CMX Data Op Codes

| Op Code | Operation |
|---------|-----------|
| 00 | 00 (independent of seed) |
| 01 | 11 (independent of seed) |
| 10 | Opposite Data from Seed |
| 11 | Same Data as Seed |

COMMAND MULTIPLIER FOR BUILT-IN-SELF-TEST

BACKGROUND OF INVENTION

1. Field of Invention

The present invention relates to the built-in-self-test of embedded memories, and more particularly, to methods of generating multiple sets of inputs from a single seed set of inputs enabling high-speed testing by a lower speed BIST circuit.

2. Background of Invention

Embedded memories require special test solutions due to the unique characteristics of memory circuits. Typically, integrated circuits (ICs) that contain embedded memories also contain a Built-In-Self-Test circuit (BIST) which is used to enable the testing of the memory by generating command, address, and data (CAD) patterns for exercising the memory. Using the BIST for this purpose enables the use of an external logic tester to test the logic portion of the IC as well as the embedded memory.

Testing embedded memories at their highest operating speed (that is the shortest command cycle time) requires that the CAD patterns be generated at that high operating speed. However, as memory speeds increase, it becomes difficult for a BIST to calculate the CAD pattern in this short cycle time, particularly given the circuit area constraints placed on the BIST.

As embedded memory performance and complexity continues to increase, BIST testing at application speeds also becomes more important; hence, novel schemes that support increased BIST performance, while still maintaining BIST flexibility and minimizing design schedule and chip area are of great value. An architecture that allows for a single BIST that can test a diverse range of memory types and sizes at a number of different performance points would be advantageous.

SUMMARY OF INVENTION

One solution to this problem is to employ a "command multiplier" circuit (CMX), which is placed between the BIST and the memory. The CMX accepts CAD information from the BIST at a relatively low speed, generates additional CAD information (i.e., "multiplies" the pattern data) and then delivers it to the memory at its maximum operating frequency. This has several clear advantages:

i) The BIST itself can operate at a relatively low speed.

ii) If a chip contains multiple embedded memories, then the CMX can be located locally to each memory, and the BIST can be shared among multiple memories, saving chip area.

iii) The BIST to CMX bus, which may be quite long, can run at the lower frequency, while only the much shorter CMX to memory bus will run at maximum frequency.

The general concept of command multiplication has been attempted as described in U.S. Pat. No. 6,647,524 entitled "Built-In-Self-Test Circuit for RAMBUS Direct RDRAM" (issued Nov. 11, 2003 to Huang and Kwai).

The present invention discloses apparatus and a method for generating CAD information which are flexible enough to allow in-depth characterization of data pattern related defects, while still allowing efficient circuit layout. At least one of the techniques enables multiple address generation for testing a memory with concurrent refresh or multiple ports.

A command multiplication scheme is described in which CAD information provided by the low-speed BIST is used as a "seed" set for the generation of high-speed CAD patterns output to the memory. Specifically, the CMX described here takes seed CAD information from a BIST operating at a frequency, $f_{BIST}$, and generates n sets of CAD data. Each generated CAD set is then output in turn to a memory system at a frequency that is equal to $f_{BIST} \times n$.

The CMX's CAD generation is accomplished by modifying the seed set based on the contents of previously loaded registers or previously set input signals. The modification can be anything from combining the seed set in a bit-wise fashion with the bits of a directive register through a logic unit (LU) to the addition of an offset using an arithmetic-logic unit (ALU). In the case of the latter, generating an address in a non-bit-wise manner is particularly important for simulating a worst-case noise condition in a multi-bank operation.

This invention is also directed to support multiple address generation from a common seed address using different address offsets for each address port. Generating multiple addresses is an important requirement when testing a memory with a concurrent refresh or multiple ports.

The inventive apparatus described may also be used to generate complex CAD patterns including non-bit-wise address sequences and multiple address generation. This results in more complete test coverage for both single and multiple port memories.

BRIEF DESCRIPTION OF DRAWINGS

The invention will be better understood from the following detailed description with reference to the drawings in which.

DETAILED DESCRIPTION

Detailed Description of Invention

Figure 1:
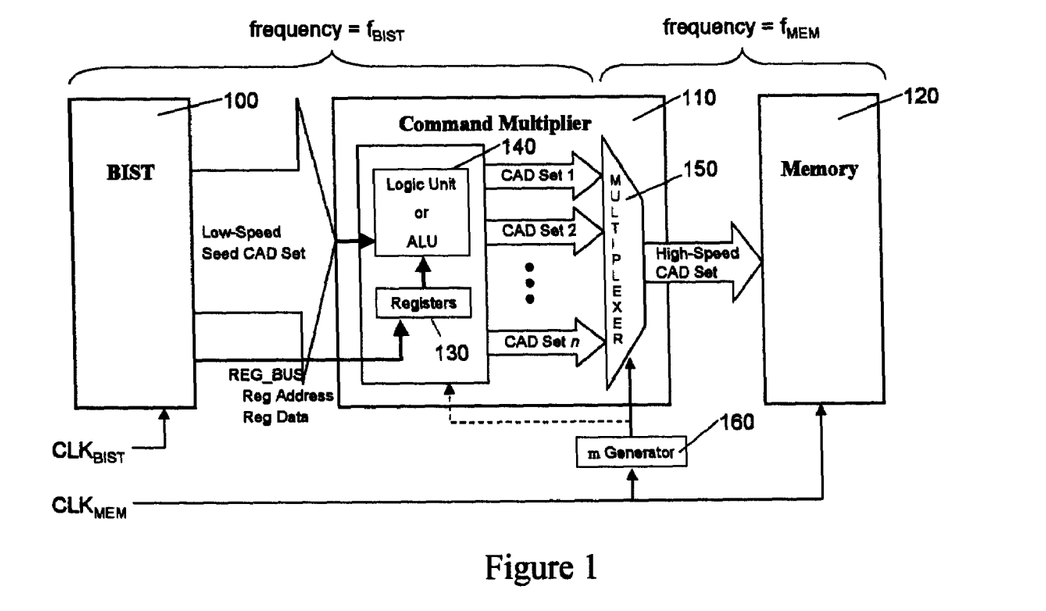
FIG. 1. A block diagram showing the interconnections of the BIST, CMX, and memory in accordance with the present invention.

FIG. 1 shows the flow of information from a low speed BIST 100, through the command multiplier (CMX) 110 to a memory system 120. During self-test, the BIST generates at low speed ($f_{BIST}$) the seed set of CAD information, such as, commands, addresses, and data, which are inputs to the CMX. This seed set of CAD information is used to generate n sets of CAD information which are output to the memory at a high speed ($f_{MEM}$), where $$f_{MEM} = f_{BIST} \times n$$

where: $f_{MEM}$ is the operating frequency of the memory,
$f_{BIST}$ is the operating frequency of the BIST,
n is the frequency multiplier.

This invention can be realized by several different configurations or embodiments shown in FIGS. 2, 3, 4, 5, and 6. Generally, configurations shown in FIGS. 2–5 generate the CAD sets in a bit-wise fashion by combining the seed CAD set with the contents of a directive register 130 through logic unit LU to a multiplexer 150. The configuration shown in FIG. 6 generates the "n" CAD sets based on offsets which are combined with the seed set in an ALU 140.

Note that the contents of the CMX registers 140 in the command multiplier 110, which could be directives or offset registers, switch at frequencies less than $f_{BIST}$ and typically will be static for an entire set of patterns generated by the BIST. As indicated in FIG. 1, these registers can be loaded via a dedicated, low-speed bus (REG_BUS) or by any other low speed means such as, for example, by an external tester.

Bit-Wise CAD Generation

For bit-wise generation n clocks of frequency $f_{BIST}$ are provided as inputs to the command multiplier shown in FIGS. 2–5, each of which is 360/n degrees out of phase from another. That is, if the i'th input clock is known as $CLK_{in,i}$, then $CLK_{in,i+1}$ is advanced by 360/n degrees from $CLK_{in,i}$ for all i=2 to n. The duty cycle of the input clocks should be 1/(2×n). Such clocks may be generated from an external tester, or from an on-chip DLL circuit.

The command multiplier 110 output clock is derived from the logical-or'ing function of all $CLK_{in,i}$ signals. Hence, the active edge of each $CLK_{in,i}$ signal identifies the start of the memory cycle. Thus, there will be "n" memory cycles associated with each BIST cycle.

With each CAD signal is associated from 1 to "n" directives that are stored in the directive registers. Each directive may consist of one or more bits. Directive registers switch at frequencies less than $f_{BIST}$ and typically will be static for an entire set of patterns generated by the BIST. The directives for a given CAD signal will be used to determine the output CAD set during each of the n embedded memory cycles that occur during a particular BIST cycle based on the output of the BIST and the state of the directive registers. Hence the output of the command multiplier is:

CAD_out(i, m)=function(CAD_in(i), Directives(i), m)

where

CAD_out(i, m) is the i'th output CAD bit during the m'th of n embedded memory cycles associated with a BIST cycle, function is a logical function, CAD_in(i) is the i'th input CAD bit which is supplied by the BIST and may change each BIST cycle, Directives(i) are input directives associated with the i'th CAD bit. They are constant for one to many BIST cycles, m describes one of the n embedded memory cycles that make up one BIST cycle.

For example, there may be n directives, with each directive consisting of one bit. If the m'th directive bit is set in the m generator 160 that may be input to the multiplexer 150 or register 130, this could indicate that the CAD output is the inverse of the CAD input. If the directive bit is not set, then the CAD output is to equal the CAD input. Logically this is described as:

CAD_out(i, m)=CAD_in(i) XOR Directive(i, m)

where

Figure 2:
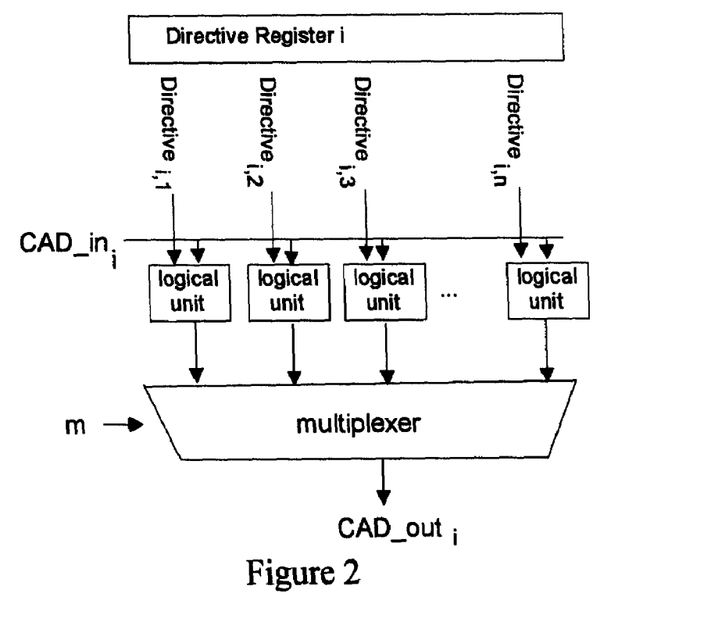
FIG. 2. A block diagram of a bit-wise command multiplier in accordance with a first embodiment of the present invention.

Directive(i, m) describes the m'th directive bit for the i'th CAD signal. Such a scheme can be implemented in a circuit as shown in FIG. 2.

Figure 3:
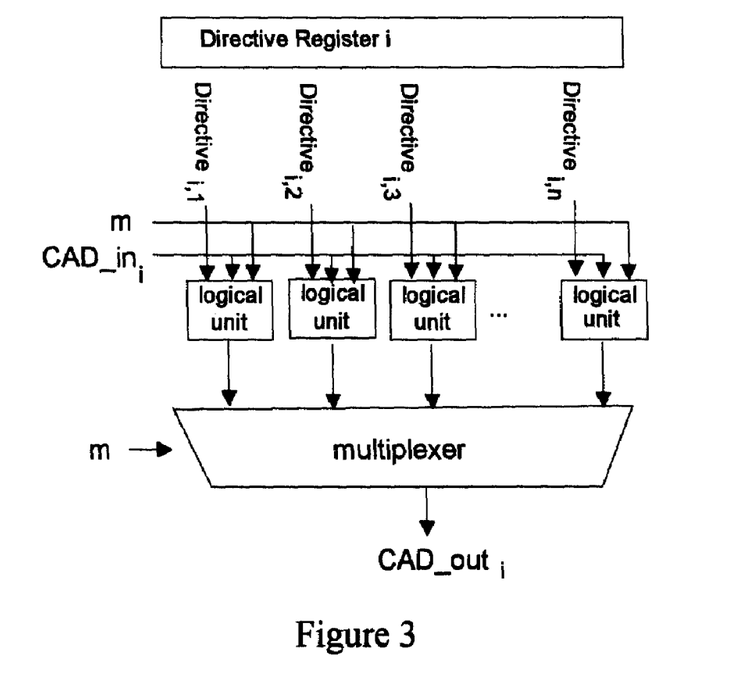
FIG. 3. A block diagram of a bit-wise command multiplier in accordance with a second embodiment of the present invention.
Figure 4:
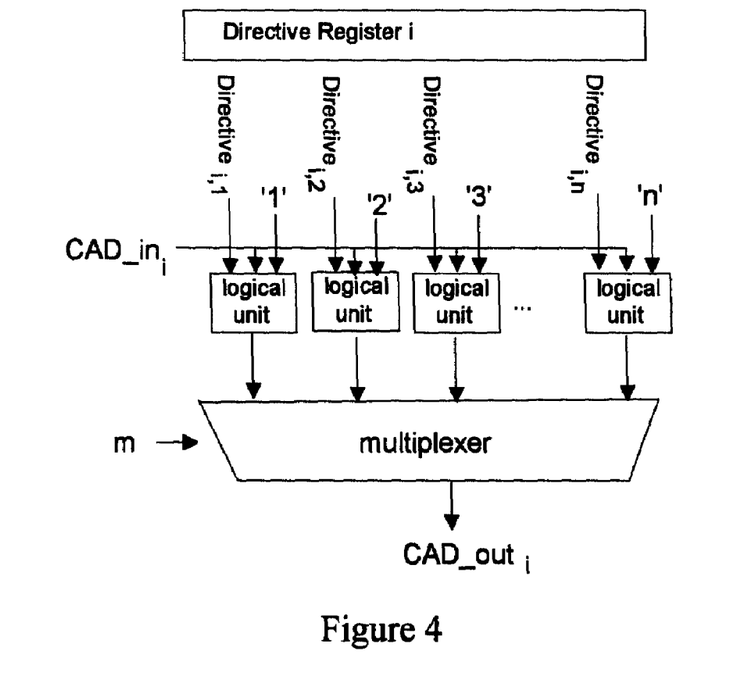
FIG. 4. A block diagram of a bit-wise command multiplier in accordance with a third embodiment of the present invention.
Figure 5:
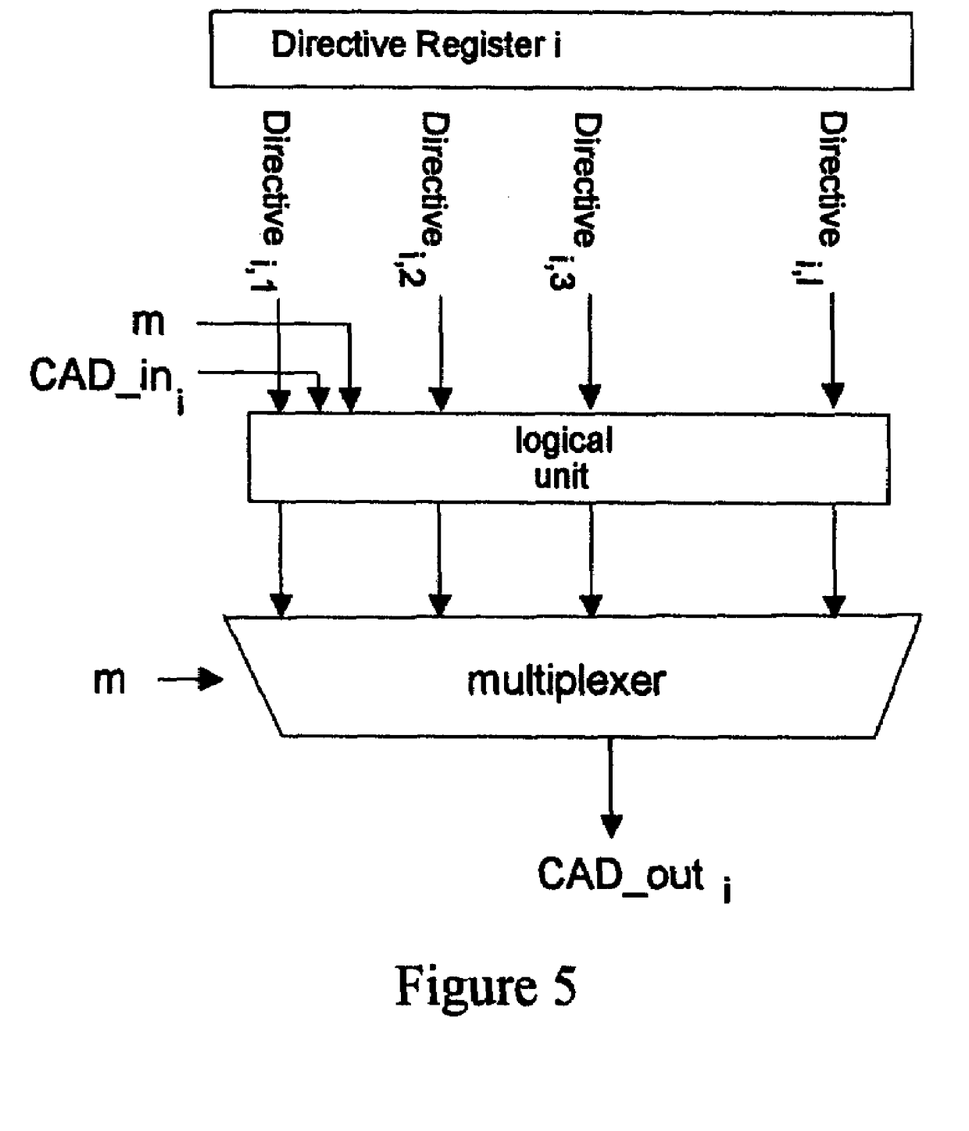
FIG. 5. A block diagram of a bit-wise command multiplier in accordance with a fourth embodiment of the present invention.

An alternate embodiment is shown in FIG. 3, where the embedded memory cycle is an input to the logical function. Still other embodiments are shown in FIGS. 4 and 5.

In general, each Directive register(i, n) may be any number of bits. More bits may be used to enable more complicated or more flexible logical functions. Examples of some functions that may be performed using the directives are given below.

EXAMPLE 1

As shown in the embodiment in FIG. 2 where each Directive(i, m) is a single bit.

Logical function=Directive(i, m) XOR CAD_in(i)

EXAMPLE 2

As shown in the embodiment in FIG. 2 where each Directive is two bits,

Directive_A(i,m) and Directive_B(i, m).

Logical function=((Directive_A(i, m) AND Directive_B(i, m)) OR (Directive_A(i, m) XOR CAD_in(i))) AND (Directive_A(i, m) OR Directive_B(i, m))

EXAMPLE 3

As shown in the embodiment of FIG. 3 or 4 where "n" is four, and the m in-put to the command multiplier is encoded as a 2-bit word made of bits $m_1$ and $m_2$.

Also let each directive be one bit.

Logical Function=CAD_in(i) XOR (Directive(i, m) XOR $m_1$) XOR (Directive(i, m) XOR $m_2$)

EXAMPLE 4

The behavior of Example 3 may be realized using the embodiment of FIG. 5. However, in this case, by utilizing the 2-bit encoding of the m variable, the number of directives can be reduced to two, with each directive consisting of 1-bit. In general, it is often possible to have fewer than m directives in this configuration.

Logical function=CAD_in(i) XOR (Directive(i, 1) XOR $m_1$) XOR (Directive(i, 2) XOR $m_2$)

In addition to the circuitry described above, delays and pipeline stages must be added to assure that the CAD_out signals are synchronized with the output clock.

CAD Generation Based on Offsets

A memory which supports concurrent refresh (CCR) requires two bank addresses for each high-speed cycle, one for the command and one for the refresh. This means that, at the same time a READ, WRITE, or no-operation (NOP) command is being performed to bank address BA, a refresh is being performed to bank address RBA, which was generated using the same seed. Alternatively, separate seeds could be used to generate the n bank addresses for the command and CCR. A non-bit-wise addressing sequence may be accomplished by an offset addressing approach. As indicated above, the CMX 110 in FIG. 1 may include an offset address register and an ALU to generate the subsequent high-speed addresses. The detailed operation is described below.

Prior to the actual self-test, the BIST loads the n sets of CMX registers 130 via the REG_BUS. The register bits in the CMX contain the offset used to generate the subsequent high-speed addresses. When the BIST engine generates the seed CAD, the seed CAD information is captured by the CMX in synch with the low-speed clock ($CLK_{BIST}$). The subsequent addresses for each command and refresh are then calculated by the adder circuit using the seed address and the corresponding address offset. The addresses are then launched to the memory in synch with the high-speed clock ($CLK_{MEM}$).

The offset addresses may or may not be constant for each clock cycle. For example, by utilizing one seed bank address, BA, and two sets of n bank address offsets, OFFSET1 to OFFSETn for the command and OFFSETR1 to OFF-SETRn for refresh, the CMX can generate n high-speed bank addresses and n high-speed CCR addresses:

Command Addresses CCR Addresses

BA+OFFSET1 BA+OFFSETR1

BA+OFFSET2 BA+OFFSETR2

. . .

BA+OFFSETn BA+OFFSETRn

Because OFFSETi and OFFSETRi may be any integer, any addressing sequence can be generated. As discussed in the background, the most typical example is the address generation of b, b+1, b+2, . . . b+n, where b is any integer, which enables a worst-case noise pattern in a multi-bank operation. For example, a command operation and a CCR operation can be issued to two adjacent banks, b and b+1, simultaneously.

The number of OFFSET registers can be increased to allow the testing of multi-port memories.

Since the address space of a memory is finite, the result of the addition of a bank address seed and an offset will typically be truncated such that any binary carry that would produce an address that is outside of the address space of the memory is ignored.

Alternatively, the subsequent address generation may be determined by not only the seed and the contents of the CMX register's offset address, but also previous CAD seed inputs. For example, in order to perform a refresh on every other high-speed cycle, a counter could keep track of the number of refreshes so that the first eight refreshes to a 16 bank memory would be to the even banks, the next eight would be to odd banks, then even banks, then odd banks, and so on.

Figure 6:
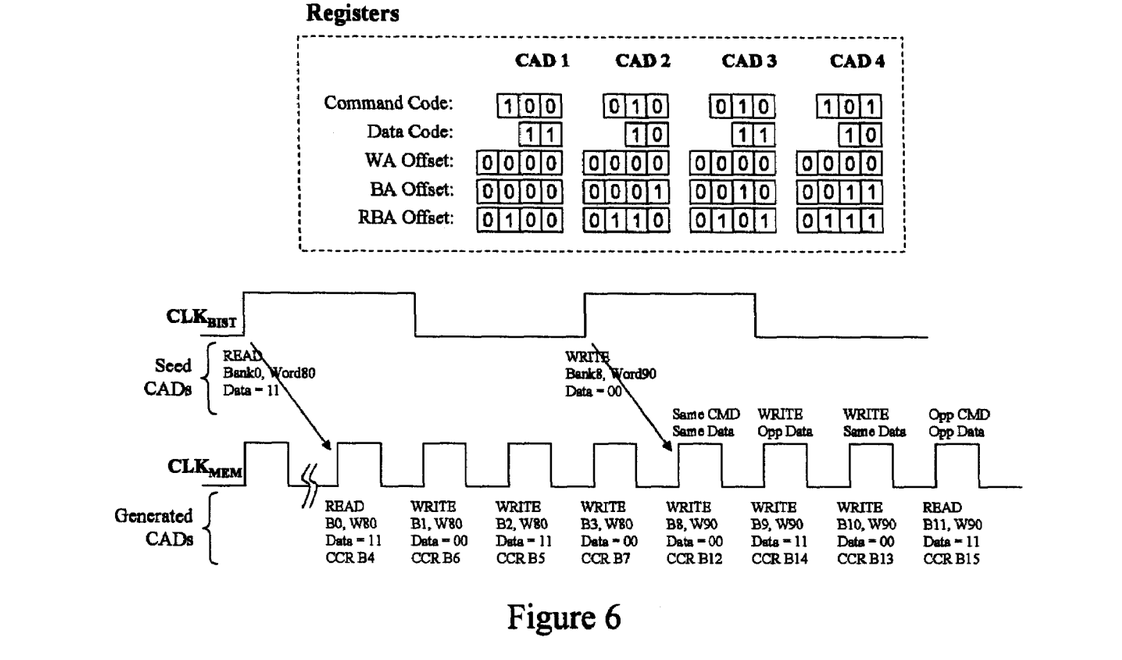
FIG. 6. An example of a timing diagram for CAD generation based on offsets where n equals 4.

FIG. 6 illustrates another embodiment of CAD generation in which:

n=4;

the CMX generates the word address WA, the bank address BA, and the refresh bank address RBA by adding an offset (contained in the CMX registers) to the seed addresses provided by the BIST;

only two data bits (DATA) are generated, one for all even data inputs of the memory, and one for all odd data inputs; these are generated based on op codes loaded into the CMX;

the high-speed command information (CMD) is generated based on op codes loaded into the CMX.

Figure 7:
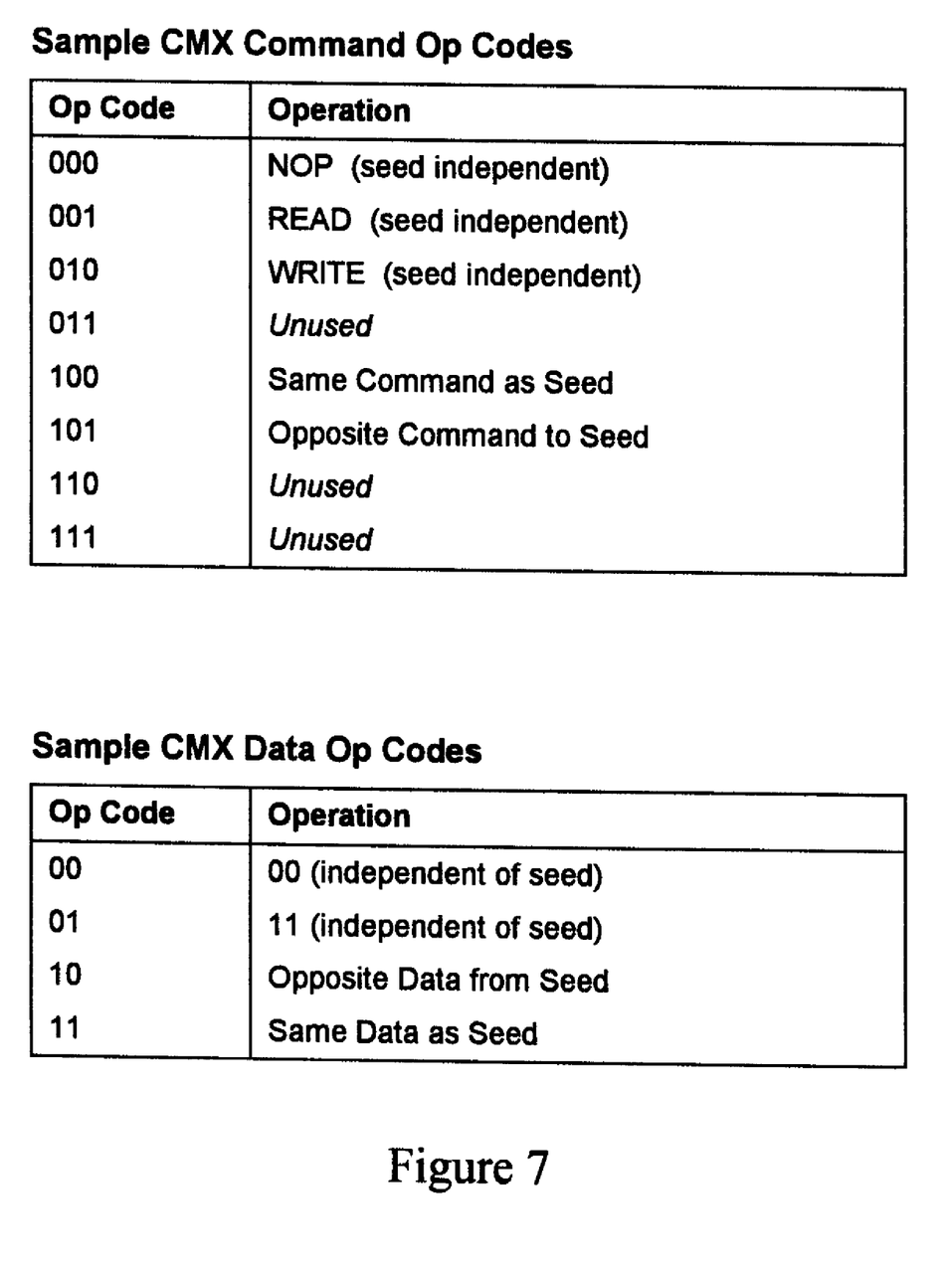
FIG. 7. Tables illustrating CMX command and data op codes.

The command and data op codes are provided in FIG. 7, Tables 1 and 2, respectively. While the invention has been described in terms of preferred embodiments, those skilled in the art will recognize that the invention can be practiced with modifications within the spirit and scope of the amended claims.

The invention claimed is:

1. A command multiplier that generates sets of command, address, and data inputs (CAD) from a seed set having a plurality of bits provided at a low frequency by a BIST, to an embedded memory at a high frequency, comprising:
    a directive register;
    a logic unit;
    a multiplexer for time-multiplexing n generated CAD sets to the memory system at a frequency n times greater than the frequency at which the seed CAD set is received;
    c directive registers corresponding to c seed CAD bits, each register having n directive bits corresponding to the n CAD sets to be generated; and
    n logic units (LUs) corresponding to the n CAD sets to be generated, each LU taking as an input the i th bit of the seed CAD and one of the n bits from the i th directive register.

2. A command multiplier that generates sets of command, address, and data inputs (CAD) from a seed set having a plurality of bits provided at a low frequency by a BIST, to an embedded memory at a high frequency, comprising:
    a directive register;
    a logic unit;
    a multiplexer for time-multiplexing n generated CAD sets to the memory system at a frequency n times greater than the frequency at which the seed CAD set is received;
    c directive registers corresponding to c seed CAD bits, each register having n directive bits corresponding to the n CAD sets to be generated; and
    n logic units (LUs) corresponding to the n CAD sets to be generated, each LU taking as an input the i th bit of the seed CAD, one of the n bits from the i th directive register, and the binary-encoded time interval, m.

3. The A command multiplier that generates sets of command, address, and data inputs (CAD) from a seed set having a plurality of bits provided at a low frequency by a BIST, to an embedded memory at a high frequency, comprising:
    a directive register;
    a logic unit;
    a multiplexer for time-multiplexing n generated CAD sets to the memory system at a frequency n times greater than the frequency at which the seed CAD set is received;
    c directive registers corresponding to c seed CAD bits, each register having n directive bits corresponding to the n CAD sets to be generated; and
    n logic units (LUs) corresponding to the n CAD sets to be generated, each LU taking as an input the i th bit of the seed CAD, one of the n bits from the i th directive register, and a binary-encoded value corresponding to its directive bit input.

4. A command multiplier that generates multiple sets of command, address, and data inputs (CAD) from a seed CAD set having a plurality of bits provided at a low frequency to a memory system at a high frequency, comprising:
    c directive registers corresponding to c seed CAD bits, each register having one or more directive bits;
    a logic unit (LU) taking as an input the i th bit of the seed CAD, all of the bits from the i th directive register, and a binary-encoded time interval, m; and a multiplexer for time-multiplexing n generated CAD sets to the memory system at a frequency n times greater than the frequency at which the seed CAD set is received.

5. A command multiplier that generates multiple sets of command, address, and data inputs (CAD) from a seed CAD set having a plurality of bits provided at a low frequency to a memory system at a high frequency, comprising:

a register;
an arithmetic logic unit (ALU);
a multiplexer for time-multiplexing n generated CAD sets to the memory system at a frequency n times greater than the frequency at which the seed CAD sets are received; and
address offset registers corresponding to the n CAD sets to be generated, each contents of which is added to the corresponding seed address by the ALU to generate one of the n output addresses.

6. A command multiplier that generates multiple sets of command, address, and data inputs (CAD) from a seed CAD set having a plurality of bits provided at a low frequency to a memory system at a high frequency, comprising:

a register;
an arithmetic logic unit (ALU);
a multiplexer for time-multiplexing n generated CAD sets to the memory system at a frequency n times greater than the frequency at which the seed CAD sets are received; and
op-code registers corresponding to the n CAD sets to be generated, each contents of which is combined with the corresponding seed CAD control signals to generate one of the n of that control signal.

7. A method for generating multiple sets of command, address, data inputs (CAD) from a seed CAD set having a plurality of bits provided by a BIST at low speed $f_{BIST}$ to a memory system at a higher speed $f_{MEM}$ comprising the steps of:

Loading a command multiplier register from the BIST;
Sending the seed CAD set from the BIST to a logic block to generate n CAD sets; and
providing the n CAD sets to a multiplexer to send the CAD sets to the memory system at $f_{MEM}$.

8. The method of claim 7 wherein the logic block is either a logic unit or an ALU.

* * * * *